(12) United States Patent
Yamaguchi et al.

(10) Patent No.: US 6,477,016 B1
(45) Date of Patent: Nov. 5, 2002

(54) JUNCTION ASSEMBLY OF BONDING PAD AND BUMP, AND MAGNETIC HEAD DEVICE USING THE SAME

(75) Inventors: Ooki Yamaguchi, Niigata-ken (JP); Koichi Naito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/498,955

(22) Filed: Feb. 4, 2000

(30) Foreign Application Priority Data

Feb. 5, 1999 (JP) ............................................ 11-028182

(51) Int. Cl.[7] .............................. G11B 5/55; H01R 9/09
(52) U.S. Cl. ...................................... 360/264.2; 439/83
(58) Field of Search ......................... 360/264.2, 245.8; 361/400, 743; 439/55, 153, 83

(56) References Cited

U.S. PATENT DOCUMENTS

| | | | |
|---|---|---|---|
| 5,045,249 A | * 9/1991 | Jin et al. ........................ 264/24 |
| 5,099,392 A | * 3/1992 | Miller et al. ................. 361/400 |
| 5,737,837 A | 4/1998 | Inaba |
| 5,794,330 A | * 8/1998 | Distefano et al. ............. 29/840 |
| 5,838,519 A | 11/1998 | Takizawa et al. |
| 5,844,753 A | 12/1998 | Inaba |
| 5,923,501 A | 7/1999 | Suzuki et al. |
| 6,246,548 B1 | * 6/2001 | Williams ................. 360/245.8 |
| 6,307,073 B1 | * 10/2001 | Jones ........................ 549/532 |

* cited by examiner

Primary Examiner—George J. Letscher
(74) Attorney, Agent, or Firm—Brinks Hofer Gilson & Lione

(57) ABSTRACT

A bonding pad and a copper bump are bonded to each other by soldering. When the amount of Au melting into a soldering junction is not more than 9 percent by weight, the amounts of the precipitation of compounds of Au in the solder or on the surface thereof can be reduced and the bonding strength of the soldering junction can be enhanced.

48 Claims, 6 Drawing Sheets

JUNCTION ASSEMBLY OF BONDING PAD AND BUMP, AND MAGNETIC HEAD DEVICE USING THE SAME

BACKGROUND OF THE INVENTION

1. Field of the Invention

The present invention relates to junction assemblies for use in magnetic head devices and the like, in which bonding pads provided on substrates, and bumps provided on wiring members and composed of copper or the like are bonded to each other by soldering. More particularly, the present invention relates to a junction assembly of a bonding pad having an Au film formed on the surface thereof.

2. Description of the Related Art

FIG. 10 is a cross-sectional view showing a conventional bonding pad, and FIG. 11 is a cross-sectional view showing a copper bump being soldered to the bonding pad.

The bonding pad 2 shown in FIG. 10 is formed by sequentially depositing a Cu film 2a, an Ni film 2b, and an Au film 2c on a base film 1a constituting a flexible substrate 1. Wettability in soldering is decreased when the Cu film 2a is oxidized; however, by forming the Ni film 2b, oxidation of the Cu film 2a can be prevented and the decrease in the wettability can be avoided. In addition, by forming the Au film 2c on the surface of the Ni film 2b, the wettability of the bonding pad to the solder can be further improved.

In the flexible substrate 1, a conductive pattern composed of a Cu film is formed on the base film 1a, and a part of the Cu film constituting the conductive pattern is used as the Cu film 2a of the bonding pad 2a. The surface of the conductive pattern, except for the bonding pad 2, is covered by an insulating layer, such as a resist.

A wiring member 3 shown in FIG. 11 has a conductive pattern 3b composed of copper foil formed between resin films 3a and 3a. A copper bump 3c protruding from gaps between the resin films 3a and 3a through an opening provided in one resin film 3a, is provided. The surface of the copper bump 3c is covered by a solder layer.

By contacting the copper bump 3c covered by the solder layer at the surface thereof with the bonding pad 2 and heating the wiring member 3 and the flexible substrate 1 having the bonding pad 2 formed thereon, which are sandwiched between a heater and a holding plate for heating, the solder on the surface of the copper bump 3c is melted. A solder junction portion 4 bonding the bonding pad 2 and the copper bump 3c is thus formed.

However, the conventional junction assembly has a problem in that bonding strength of the soldering junction 4 is not satisfactory.

The bonding strength of the soldering junction 4 can be measured by observing a position at which the wiring member 3 and the flexible substrate 1 separate when the wiring member 3 is pulled upward and the flexible substrate 1 is pulled downward.

When the bonding strength of the soldering junction 4 is low, the wiring member 3 and the flexible substrate 1 are separated by breakage at the position 5 indicated by a dashed line, such as the interior of the soldering junction 4 as shown in FIG. 11. That is, the separation occurs due to the breakage of the soldering junction 4. In contrast, when the bonding strength of the soldering junction 4 is high, the copper bump 3c is separated from the resin film 3a. When a plurality of samples in which the flexible substrates 1 and the wiring members 3 are bonded are pulled upward and downward, respectively, the bonding strength of the soldering junction 4 can be numerically represented. The numerical valve is calculated by comparing the samples which are separated by breakage at position 5 indicated by the dashed line in the interiors of the soldering junctions 4 to the total number of samples.

According to research conducted by the inventors, it was understood that the reason for insufficient bonding strength of the soldering junction 4 could be explained as follows. Since the Au of the Au film 2c melts into the solder when the thickness E1 at the soldering junction 4 is too great, compounds of Au and Sn generate. When compounds of Au and Sn are formed in the soldering junction 4, the compounds precipitate in the solder or on the surface thereof, and cracks in the solder readily occur.

In soldering junctions 4 of conventional bonding pads 2, the observed Au content is approximately 14 percent by weight and the, amounts of the compounds of Au and Sn in the soldering junction 4 are larger. As a result, cracks in the solder tend to readily occur. Consequently, the ratio of samples in which the soldering junctions 4 are broken at the position 5 indicated by the dashed line to the total samples reaches 5 percent.

Furthermore, in the conventional junction assembly, the thickness E1 of the Au film 2c at the surface of the bonding pad 2, as shown in FIG. 10, is so large that Au melts into the solder at the junction boundary between the soldering junction 4 and the bonding pad 2. As a result spread H1 of a solder fillet at the soldering junction 4 is suppressed. Consequently, separation at the boundary between the soldering junction 4 and the bonding pad 2 readily occurs.

The junction assembly of the bonding pad and the copper bump are used in, for example, a magnetic head device, as shown in FIG. 9.

The magnetic head is provided with a load beam 31 in which a base portion is a fixing edge 31a and a front portion is a supporting edge 31b, a flexure 32 provided at the supporting edge 31b of the load beam 31, a magnetic head body 34 mounted on the flexure 32, and a flexible substrate 33 laminated on the flexure 32.

A bonding pad 35 is formed at one edge of the flexible substrate 33.

A copper bump 37 covered by a solder layer and formed at a wiring member 36 extending from the body side of the magnetic head device is brought into contact with the bonding pad 35 and is sandwiched between a heater and a holding plate, so that a soldering junction 4 similar to that shown in FIG. 3 is formed.

In magnetic head devices and the like, since mechanical vibration is frequently generated and mechanical force is frequently applied to soldering junctions, the possibility of the generation of connection failure during use is high when a junction assembly of the conventional bonding pad and the copper bump are used.

SUMMARY OF THE INVENTION

In order to solve the problems in the conventional art described above, objects of the present invention are to provide a junction assembly of a bonding pad and a bump, which can prevent decrease in bonding strength of a soldering junction, and to provide a magnetic head device utilizing the junction assembly. In the present invention, the amount of Au in the bonding pad precipitated in the soldering junction can be suppressed, and the dimension of a spread of a solder fillet at the soldering junction can be increased.

A junction assembly according to the present invention comprises a substrate having a conductive pattern and a bonding pad formed thereon, the bonding pad being electrically connected with the conductive pattern and being provided with an Au film on the surface thereof, and a wiring member having a conductive pattern and a bump formed thereon. The bump is electrically connected with the conductive pattern, in which the bonding pad and the bump are bonded to each other by soldering. In the junction assembly described above, in a state in which the bonding pad is bonded to the bump, the thickness of the Au film is determined so that the Au content is not more than 9 percent by weight in a soldering junction between the bonding pad and the bump.

When the thickness of the Au film on the surface of the bonding pad is appropriately determined, the Au content in the soldering junction, which was conventionally approximately 14 percent by weight, can be decreased, the precipitated amounts of compounds of Au and Sn in the solder or on the surface thereof can be decreased, and a cracking of the solder becomes unlikely. In addition, when the Au film is thinned, a phenomenon of Au which melts into the soldering junction at the boundary thereof with the bonding pad can be suppressed, and decrease in wettability of the solder on the surface of the bonding pad can therefore be prevented. Accordingly, the spread of the solder fillet is larger, and separation between the solder and the bonding pad therefore becomes difficult.

In the case in which the Au content in the soldering junction is not more than 9 percent by weight, when the wiring member and the flexible substrate which are bonded to each other by soldering are pulled upward and downward, respectively, the ratio of the number of samples in which the wiring member and the flexible substrate are separated in the soldering junction can be reduced to not more than 1 percent of the total number of the sample. The ratio can be considerably decreased, compared to 5 percent that was obtained in measurements using conventional bonding pads.

More preferably, the Au content in the soldering junction is not more than 7 percent by weight. In the case in which the Au content is not more than 7 percent by weight, when the wiring member and the flexible substrate which are bonded to each other by soldering are pulled upward and downward, respectively, the ratio of the number of samples in which the wiring member and the flexible substrate are separated in the soldering junction can be reduced to 0 percent of the total number of the samples.

As methods for decreasing the Au content in the soldering junction, according to the present invention, the thickness of the Au film of the bonding pad is made to be thinner relative to the bump dimensions. In contrast, when the Au film of the bonding pad is made to be too thin, an Au film having an even thickness thereof cannot be formed, and for example, holes form in the Au film. Consequently, variation in wettability in soldering may occur, and decrease of the wettability due to oxidation of the Ni film beneath the Au film may occur.

Accordingly, in order to decrease the Au content and to prevent the generation of Au film defects, when the diameter A2 of the bump is set to be 1, the thickness E2 of the Au film at the surface of the bonding pad is preferably $0.34 \times 10^{-3}$ to $2.41 \times 10^{-3}$.

When the dimensions are set as described above, the Au content in the soldering junction can be reduced to not more than 9 percent by weight. In addition, formation of irregularities in the thickness of the Au film due to the Au film being too thin can be avoided.

More preferably, when the diameter A2 of the bump is set to be 1, the thickness E2 of the Au film at the surface of the bonding pad is $0.34 \times 10^{-3}$ to $1.72 \times 10^{-3}$.

When the dimensions are set as described above, the Au content in the soldering junction can be reduced to not more than 7 percent by weight. In addition, formation of irregularities in the thickness of the Au film due to the Au film being too thin can be avoided.

In order to prevent the formation of irregularities in the thickness of the Au film due to the Au film being too thin, in the present invention, when the diameter A2 of the bump is set to be 1, the thickness E2 of the Au film at the surface of the bonding pad is determined to be not less than $0.34 \times 10^{-3}$. In the conditions described above, the Au content in the soldering junction is not less than 1 percent by weight. Accordingly, the preferable Au content in the soldering junction is between 1 to 9 percent by weight, and more preferably, 1 to 7 percent by weight. In the case in which the diameter A2 of the bump is set to be 1, as described above, an opening diameter B2 of the wiring member into which the bump penetrates is 0.62, the bump thickness C2 from the surface of the wiring member is 0.14 to 0.31, the solder thickness D2 on the surface of the bump is 0.07 to 0.12, and the planar dimensions of the bonding pad is $1.90 \times 1.72$.

The bonding pad is preferably formed by sequentially depositing a Cu film, an Ni film covering the Cu film, and the Au film covering the Ni film.

When the Ni film covers the Cu film, oxidation of the Cu film is prevented, and wettability with the solder is improved when the Au film covers the Ni film.

In addition, the magnetic head device according to the present invention comprises a load beam fixed at the base portion thereof, a flexure provided at the front portion of the load beam, a magnetic head body mounted on the flexure, a substrate having a conductive pattern connected to the magnetic head body, and a wiring member connected to the substrate, in which the substrate and the wiring member are bonded to each other by one of the junction assemblies described above.

When a magnetic head device is manufactured by using the junction assembly according to the present invention, connection failures at the soldering junction of the bonding pad are unlikely, and a superior quality magnetic head device can be manufactured.

DESCRIPTION OF THE PREFERRED EMBODIMENTS

Figure 1:
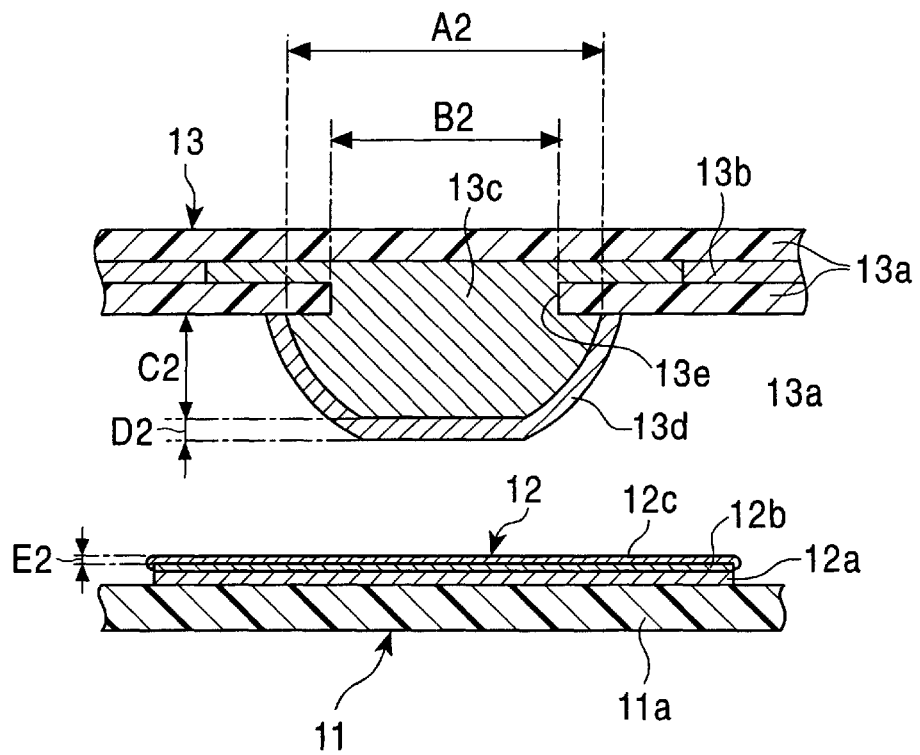
FIG. 1 is a cross-sectional view showing a bonding pad formed on a flexible substrate and a copper bump, according to the present invention.
Figure 2:
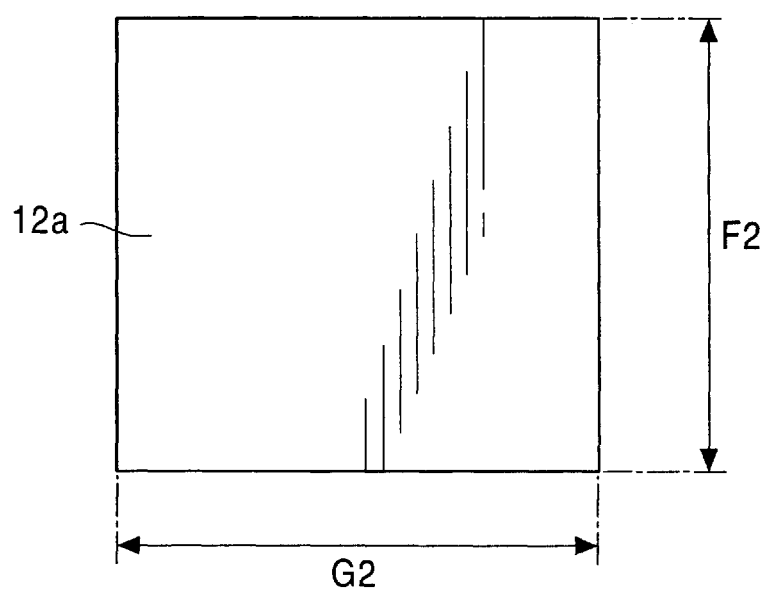
FIG. 2 is a plan view of the bonding pad shown in FIG. 1.
Figure 3:
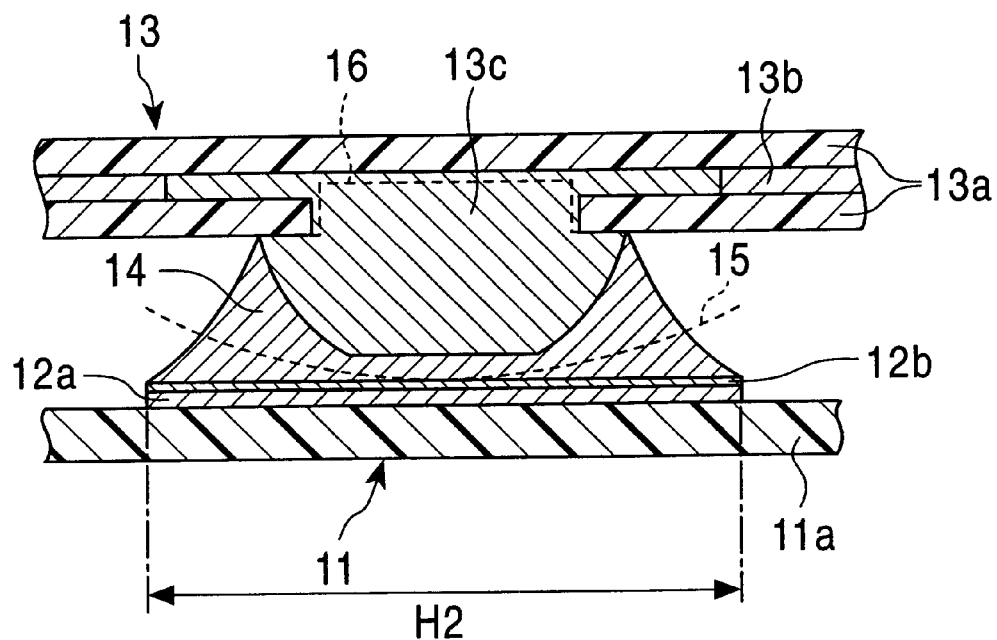
FIG. 3 is a cross-sectional view showing a state of the bonding pad formed on the flexible substrate being bonded with the copper bump of a wiring member by a soldered junction assembly.

FIG. 1 is a cross-sectional view showing a bonding pad formed on a flexible substrate and a copper bump formed on a wiring member, FIG. 2 is a plan view showing the bonding pad formed on the flexible substrate, and FIG. 3 is a cross-sectional view showing a state of the copper bump being soldered on the bonding pad.

The bonding pad 12 is formed by sequentially depositing a Cu film 12a, an Ni film 12b covering the Cu film 12a, and an Au film 12c covering the Ni film 12b on a surface of a base film 11a constituting the flexible substrate 11. A conductive pattern is formed by using a Cu film, and the Cu film forming the conductive pattern and the Cu film 12a forming the bonding pad 12 are sequentially formed by using the same material.

The conductive pattern, except for the bonding pad 12, is coated by an insulating resin, such as a resist.

The oxidation of the Cu film 12a can be prevented by the Ni film 12b, and wettability to solder can be improved by forming the Au film 12c.

As shown in FIG. 2, a planar shape of the bonding pad 12 is a rectangle having a longitudinal length indicated by F2 and a lateral length indicated by G2.

In the wiring member 13, copper foil 13b forming a conductive pattern is disposed between resin films 13a and 13a, such as a polyimide resin. One of the resin films 13a is provided with an opening 13e formed by, for example, laser processing, a copper bump 13c is formed from gaps between the resin films 13a and 13a to the surface of the resin film 13a through the opening 13e, and the copper bump 13c is connected to the copper foil 13b. A solder layer 13d is coated on the surface of the copper bump 13c.

When the bump diameter A2 of the copper bump 13c is set to be 1, preferable dimensions of the copper bump 13c and the bonding pad 12 are shown as below.

The diameter B2 of the opening 13e is 0.62, the bump thickness C2 is 0.14 to 0.31, and the thickness D2 of the solder layer 13d at the surface of the copper bump 13c is 0.07 to 0.12. Concerning dimensions of the bonding pad 12, the longitudinal length F2 is 1.90, the lateral length G2 is 1.72, and the thickness E2 of the Au film 12c is $0.34 \times 10^{-3}$ to $2.41 \times 10^{-3}$.

For example, in the embodiment according to the present invention, when the bump diameter A2 of the copper bump 13c is set to be 290 μm, it is preferable that the opening diameter B2 be 180 μm, the bump thickness C2 be 41 μm to 90 μm, the thickness D2 of the solder layer 13d be 20 μm to 35 μm, the longitudinal length F2 of the bonding pad 12 be 550 μm, the lateral length G2 thereof be 500 μm, and the thickness E2 of the Au film be 0.1 μm to 0.7 μm.

When the solder layer 13d is brought into contact with the bonding pad 12, and then the wiring member 13 and the flexible substrate 11 having the bonding pad 12 formed thereon are heated, while sandwiched between a heater and a holding plate, the solder is melted and a soldering junction (solder fillet) 14 shown in FIG. 3 is therefore formed.

Bonding strength of the soldering junction 14 can be measured by observing a position at which separation occurs between the wiring member 13 and the flexible substrate 11 when the wiring member 13 is pulled upward and the flexible substrate 11 is pulled downward.

When the bonding strength of the soldering junction 14 is low, the wiring member 13 and the flexible substrate 11, for example, are separated at the position 15 indicated by a dashed line, by breakage inside the soldering junction 14. That is, cracks are generated in the soldering junction 14, and the soldering junction 14 is broken by the growth of the cracks, whereby the flexible substrate 11 and the wiring member 13 are separated. In addition, when the wettability of the bonding pad 12 to the solder is poor, the soldering junction (solder fillet) 14 and the bonding pad 12 are separated at the boundary area thereof.

In contrast, when the bonding strength between the soldering junction 14 and the bonding pad 12 is high, the separation thereof occurs at the position 16 indicated by a dashed line, due to the separation of the copper bump 13c at the foot thereof from the resin film 13a.

When a plurality of samples in which the bonding pads 12 and the wiring members 13 are bonded to each other are pulled upward and downward, respectively, the bonding strength of the soldering junction 14 can be numerically represented by measuring the ratio of samples which are separated by breakage at position 15 indicated by the dashed line in the interior of the soldering junction 14, to the total number of samples.

Figure 4:
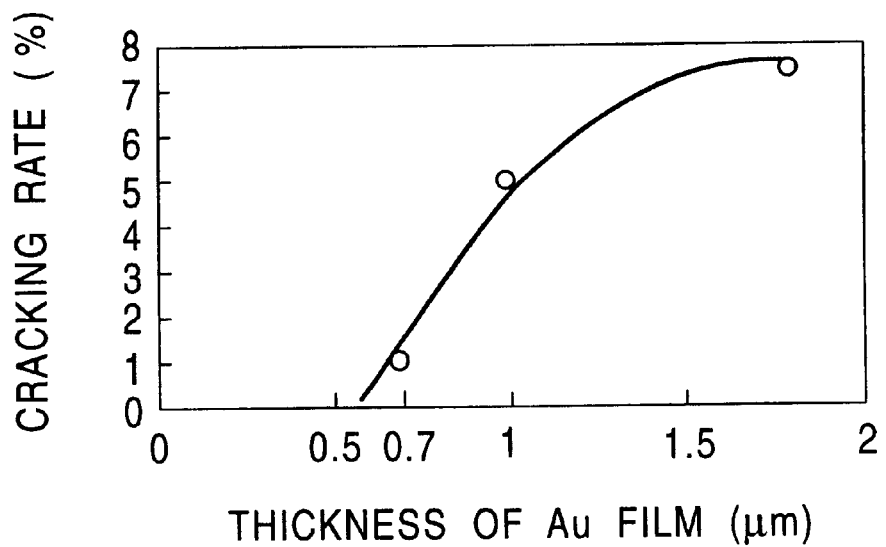
FIG. 4 is a graph showing the relationship between the thickness of an Au film covering a surface of the bonding pad and the cracking rate of the soldered junction assembly.

FIG. 4 is a graph showing a ratio of the samples in which the flexible substrate 11 and the wiring member 13 were separated at the position 15 indicated by the dashed line in the soldering junction 14 when the thickness of the Au film 12c covering the surface of the bonding pad 12 was changed.

When the bump diameter A2 of the copper bump 13c was set to be 290 μm, the dimensions of the samples used for the measurement were: 180 μm of the opening diameter B2, 41 μm to 90 μm of the bump thickness C2, 20 μm to 35 μm of the thickness D2 of the solder layer 13d, 550 μm of the longitudinal length F2 of the bonding pad 12, and 500 μm of the lateral length G2 thereof.

In FIG. 4, when the thickness of the Au film 12c was not more than 0.7 μm, the ratio of the samples separated between the wiring member and the flexible substrate in the soldering junction 14 to the total number of the samples was not more than 1%. In addition, the ratio thereof further decreased when the thickness of the Au film 12c was reduced.

Figure 5:
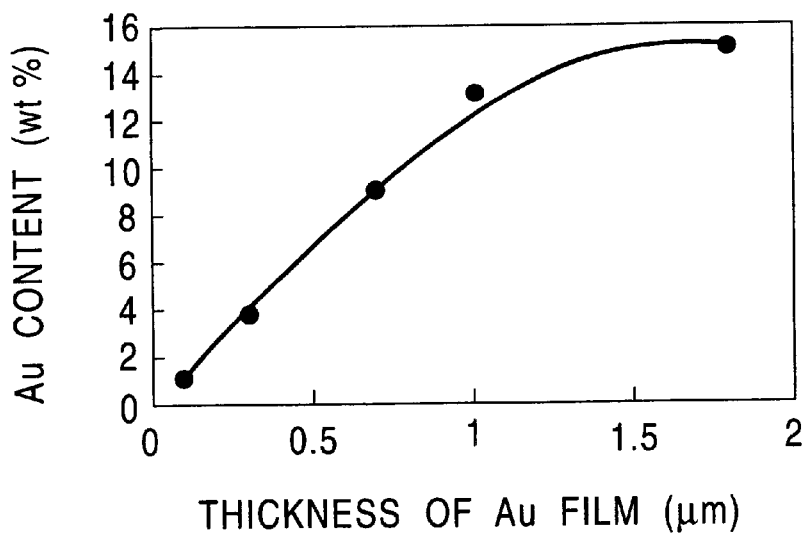
FIG. 5 is a graph showing the relationship between the thickness of the Au film covering a surface of the bonding pad and the Au content in the soldered junction assembly.

FIG. 5 is a graph showing the relationship between the thickness of the Au film covering a surface of the bonding pad and the Au content in the soldering junction.

It was confirmed that the Au content in the soldering junction 14 decreased along with the decrease of the thickness of the Au film. When the thickness of the Au film was not more than 0.7 μm, the Au content in the soldering junction 14 was not more than 9 percent by weight.

As can be seen from FIG. 4, when the thickness of the Au film 12c was not more than 0.5 μm, the number of the samples in which the wiring member and the flexible substrate were separated due to the breakage of the soldering junction 14 was 0% of the total sample numbers, and the Au content in the soldering junction 14 was 7 percent by weight as seen in FIG. 5. Accordingly, it was understood that the Au content in the soldering junction 14 is more preferably not more than 7 percent by weight.

In the bonding pad 12 of the embodiment according to the present invention, when the thickness of the Au film 12c was not more than 0.1 $\mu$m, the uniform thickness of the Au film 12c could not be obtained due to generation of holes in the Au film 12c, and as a result, it was confirmed that variation in wettability during soldering could occur, and the wettability was decreased due to oxidation of the Ni film disposed beneath the Au film 12c. Hence, it is necessary that the thickness of the Au film 12c be not less than 0.1 $\mu$m.

When the thickness of the Au film 12c is 0.1 $\mu$m, the Au content in the soldering junction 14 was 1 percent by weight. In the embodiment according to the present invention, the Au content in the soldering junction 14 was not more than 9 percent by weight when the individual dimensions were set to be as follows: 290 $\mu$m of the bump diameter A2 of the copper bump 13c, 180 $\mu$m of the opening diameter B2 by formed by laser processing, 41 $\mu$m to 90 $\mu$m of the bump thickness C2, 20 $\mu$m to 35 $\mu$m of the thickness D2 of the solder layer 13d, 550 $\mu$m of the longitudinal length F2 of the bonding pad 12, 500 $\mu$m of the lateral length G2 thereof, and not more than 0.7 $\mu$m of the thickness of the Au film. When the thickness of the Au film was set to be not more than 0.5 $\mu$m, the Au content in the soldering junction 14 was not more than 7 percent by weight.

In addition, when the thickness of the Au film is set to be not less than 0.1 $\mu$m, formation of irregularities in the thickness of the Au film 12c due to generation of holes therein can be prevented.

The Au content in the soldering junction 14 is constant so long as the ratio of the dimensions of the individual parts to the bump diameter A2 of the copper bump 13c are maintained to be constant, even when the specific dimensions of the individual parts of the copper bump 13c, the solder layer 13d, and the bonding pad 12, are changed.

Accordingly, the content of Au melting into the soldering junction 14 can be not more than 9 percent by weight, and an Au film having uniform thickness can be formed on the bonding pad, when the dimensions of individual parts of the copper bump 13c to the diameter A2 of the bump are; the opening diameter B2 is 0.62, the bump thickness C2 is 0.14 to 0.31, the thickness D2 of the solder layer 13d on the surface of the copper bump 13c is 0.07 to 0.12, and in addition, the longitudinal length F2 of the bonding pad 12 is 1.90, the lateral length G2 thereof is 1.72, and the thickness of the Au film 12c is $0.34 \times 10^{-3}$ to $2.41 \times 10^{-3}$.

When the thickness of the Au film is $0.34 \times 10^{-3}$ to $1.72 \times 10^{-3}$, the content of Au melting into the soldering junction 14 can be not more than 7 percent by weight, and the Au film having uniform thickness can be formed on the bonding pad.

In addition, when the ratio of the thickness of the Au film to the bump diameter A2 of the bump is $0.34 \times 10^{-3}$, the Au content in the soldering junction 14 is not less than 1 percent.

Since the Au content in the soldering junction of a conventional bonding pad and a copper bump was approximately 14 percent by weight, the Au content in the soldering junction 14 according to the present invention is less than that in the conventional soldering junction, whereby precipitation of compounds of Au and Sn in the soldering junction 14 is suppressed and the bonding strength of the soldering junction 14 can be improved.

In addition, since the Au film 12c is thin, the wettability between the soldering junction 14 and the bonding pad 12 can be improved, and the dimension of the spread H2 of the soldering junction 14 can be enlarged. Consequently, the separation of the soldering junction 14 from the bonding pad 12 can be avoided.

Figure 6:
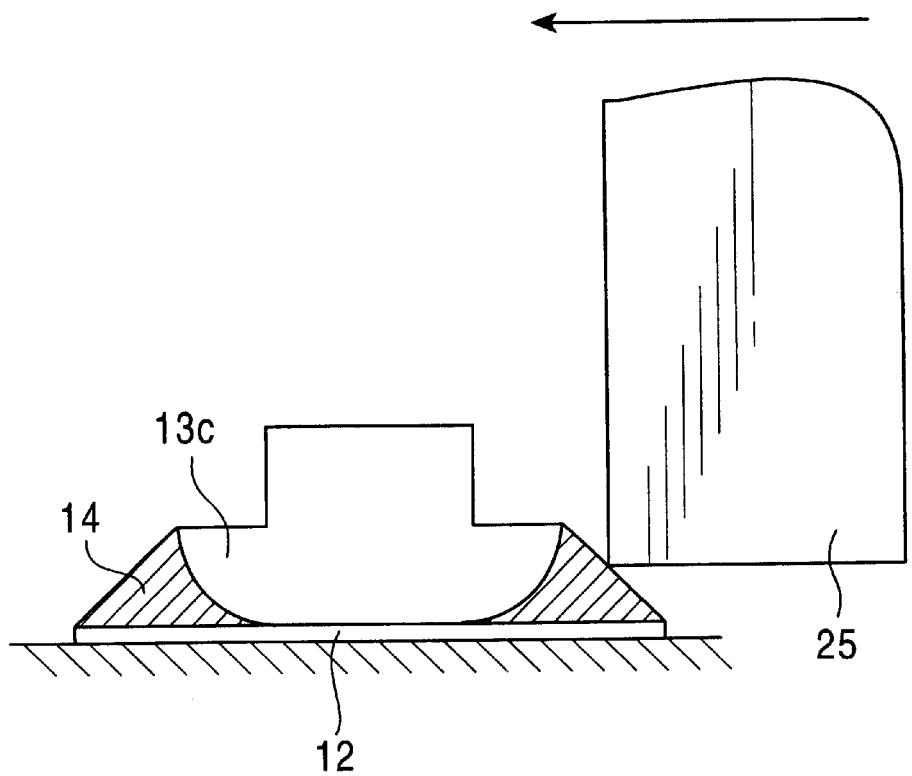
FIG. 6 is a schematic view showing a method for measuring shear strength of the soldered junction assembly.

FIG. 6 is a schematic view showing a method for measuring the shear strength of the soldering junction.

After soldering the copper bump 13c of the wiring member to the bonding pad 12 formed on the flexible substrate according to the present invention, the wiring member and the flexible substrate were separated by pulling upward and downward, respectively. The samples, in which the soldering junction 14 were not broken and the resin films 13a of the wiring members 13 were separated from the copper bump 13c at the foot thereof, were employed in the measurement.

After pushing a shearing tip 25 to the soldering junction 14 of the sample, the shearing tip is moved in the horizontal direction at a rate of 0.1 mm/second so as to measure necessary force (gf) to break the soldering junction 14.

Figure 7:
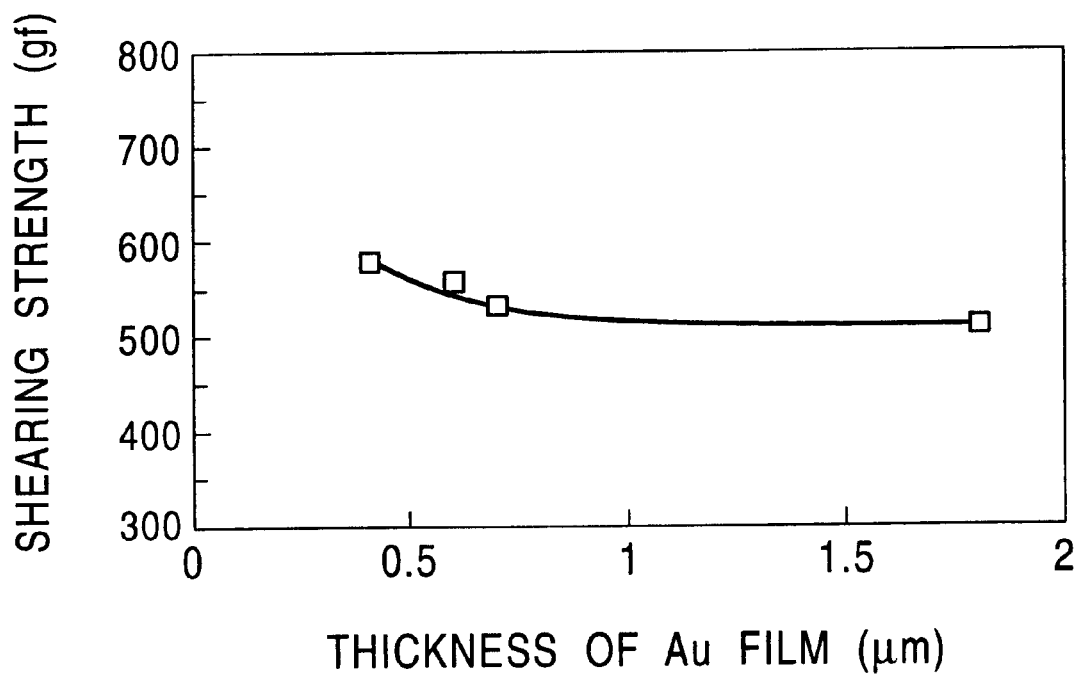
FIG. 7 is a graph showing the relationship between the thickness of an Au film covering a surface of the bonding pad formed on the flexible substrate and shear strength of the soldered junction assembly.

FIG. 7 is a graph plotting the thickness ($\mu$m) of the Au film 12c covering the surface of the bonding pad 12 of the embodiment according to the present invention on the abscissa and the force (shearing strength gf) to break the soldering junction 14 on the ordinate.

When the thickness of the Au film was not less than 0.7 $\mu$m, shearing strength of the soldering junction was nearly constant between 510 gf and 530 gf; however, when the thickness of the Au film was not more than 0.7 $\mu$m, as those described in the embodiment of the present invention, the shearing strength rapidly increased, so that the shearing strengths were 560 gf and 580 gf for a 0.5 $\mu$m-thick Au film and 0.4 $\mu$m-thick Au film, respectively. As can be seen from those results, the soldering junction of the junction assembly of the bonding pad and the copper bump according to the present invention increased the bonding strength.

Figure 8:
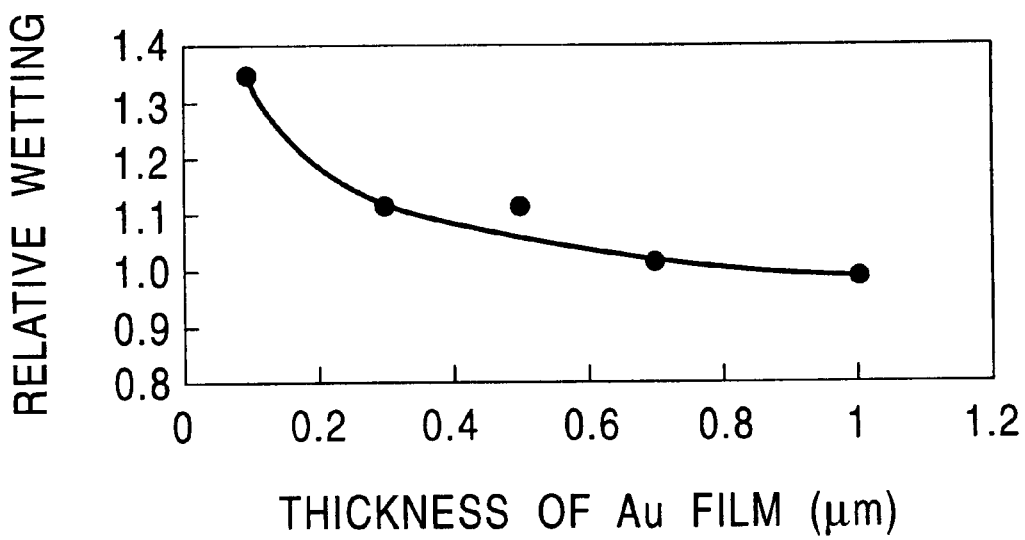
FIG. 8 is a graph showing the relationship between the thickness of the Au film covering a surface of the bonding pad formed on the flexible substrate and the relative diameter of solder wetting at a soldering junction 14.

FIG. 8 is a graph plotting the thickness ($\mu$m) of the Au film 12c covering the surface of the bonding pad 12 of the embodiment according to the present invention on the abscissa and the relative diameter H2 of solder wetting of the soldering junction 14 on the ordinate.

The diameter of solder wetting is a diameter H2 at the foot of the soldering junction (solder fillet) 14 shown in FIG. 3 spreading to the periphery. In FIG. 8, the ratio of the radius H2/2 of the solder wetting portion to the diameter H2 thereof is plotted in ordinate in the case in which the diameter H2 is set to be 1 when the thickness of the Au film 12c is 1 $\mu$m.

When the thickness of the Au film 12c was not more than 0.7 $\mu$m, the relative diameter H2 of solder wetting increased. Specifically, when the thickness of the Au film 12c was not more than 0.5 $\mu$m, the relative diameter H2 of solder wetting remarkably increased.

In the embodiment according to the present invention, as shown in FIG. 5, when the thickness of the Au film 12c was not more than 0.7 $\mu$m the Au content in the soldering junction 14 was not more than 9 percent, and when the thickness of the Au film 12c was not more than 0.5 $\mu$m, the Au content in the soldering junction 14 was not more than 7 percent.

Accordingly, as can also be seen from FIGS. 7 and 8, the Au content in the soldering junction 14 was preferably not more than 9 percent, and more preferably not more than 7 percent, in order to obtain superior bonding at the soldering junction.

It was confirmed by the inventors of the present invention that the peel strength of the junction assembly was not less than 40 g when the individual dimensions were set to be as follows: 260 μm to 350 μm of the bump diameter A2 of the copper bump 13c, 180 μm of the opening diameter B2, 40 μm to 90 μm of the bump thickness C2, 20 μm to 36 μm of the thickness D2 of the solder layer 13d, 550 μm of the longitudinal length F2 of the bonding pad 12, 500 μm of the lateral length G2 thereof, and 0.1 μm to 0.7 μm of the thickness of the Au film.

Figure 9:
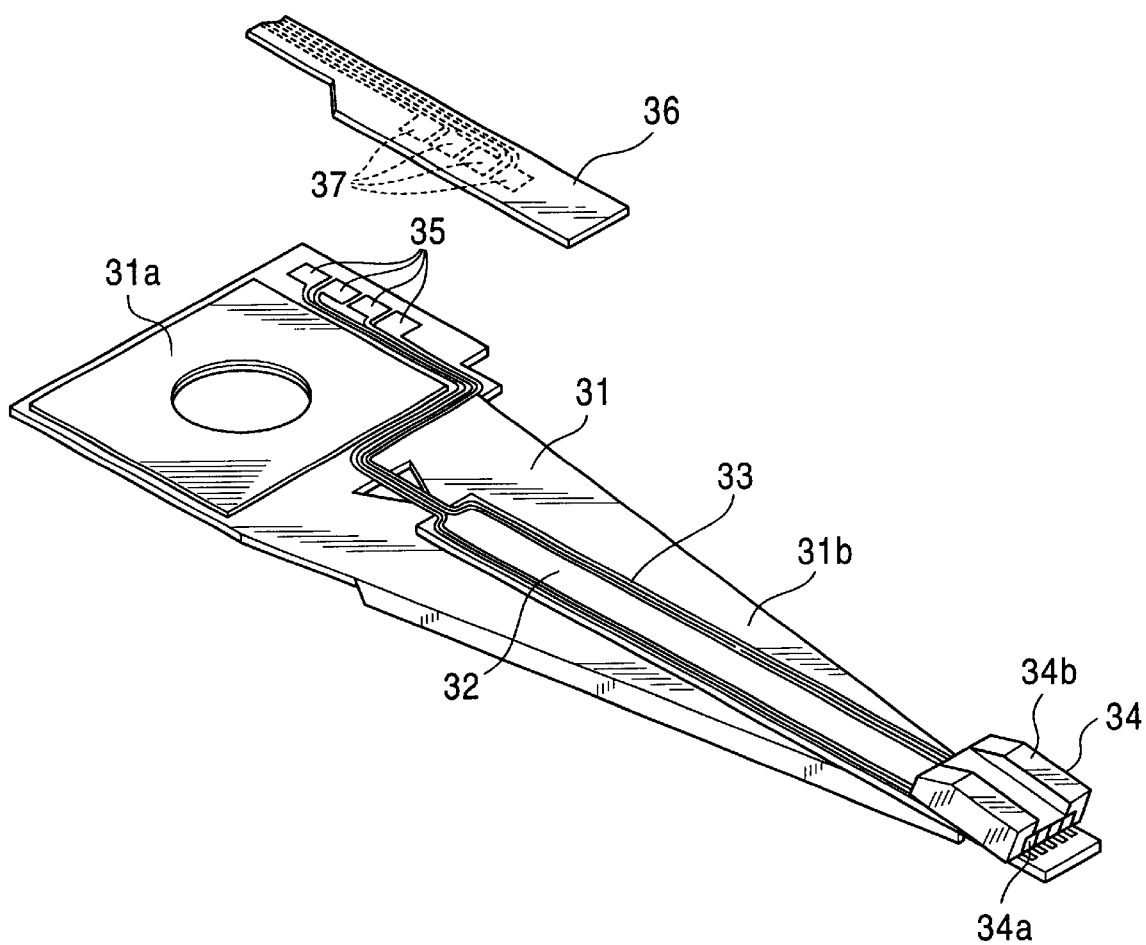
FIG. 9 is a perspective view showing an embodiment of a magnetic head device using the bonding pad according to the present invention.
Figure 10:
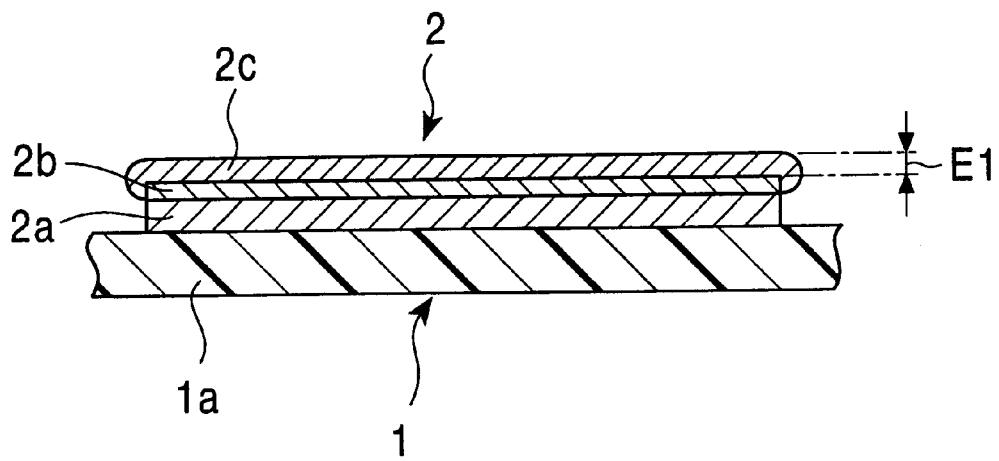
FIG. 10 is a cross-sectional view showing a conventional bonding pad formed on a flexible substrate and a conventional copper bump.
Figure 11:
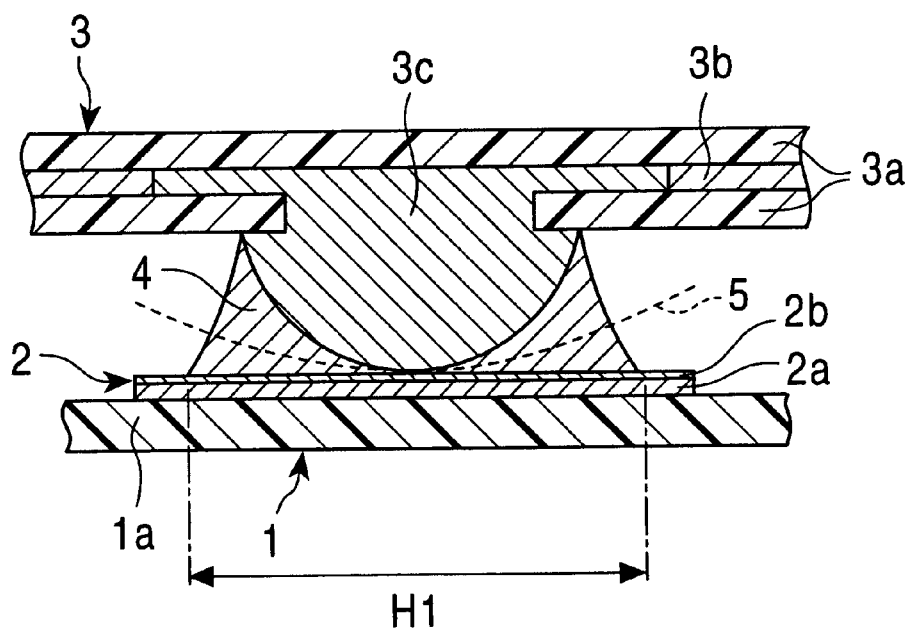
FIG. 11 is a cross-sectional view showing a state of the conventional bonding pad formed on the flexible substrate being bonded with the conventional copper bump by a soldering junction.

FIG. 9 is a perspective view showing an embodiment of a magnetic head device provided with the junction assembly of the bonding pad and the bump according to the present invention.

The magnetic head device comprises a load beam 31 in which a base portion is a fixing edge 31a and a front portion is a supporting edge 31b, a flexure 32 provided at the supporting edge 31b of the load beam 31, a magnetic head body 34 mounted on the flexure 32, and a flexible substrate 33 laminated on the flexure 32.

In the flexible substrate 33, a conductive pattern composed of a conductive metal film is formed on a surface of a base film, and an insulating layer is formed on the conductive pattern.

At the one edge portion of the flexible substrate 33, the conductive pattern is electrically connected to an electrode 34a formed at a trailing edge of a slider 34b constituting the magnetic head body 34.

At the other edge portion of the flexible substrate 33, the bonding pad 35 according to the present invention is formed.

A copper bump 37 covered by a solder layer and formed at a wiring member 36 extended from a magnetic head control circuit of the magnetic head device, is brought into contact with the bonding pad 35 and is sandwiched between a heater and a holding plate. Consequently, a soldering junction 14 similar to those shown in FIG. 3 is formed, and the junction assembly according to the present invention is therefore formed.

In the case described above, the Au content in the soldering junction bonding the bonding pad 35 with the copper bump 37 is not more than 9 percent by weight, and more preferably, not more than 7 percent by weight.

In the present invention, in the case in which the individual dimensions of the copper bump 37 are represented by ratios to the bump diameter of the copper bump 37, that is, when the diameter of the copper bump 37 is set to be 1, the opening diameter is 0.62, the thickness of the bump is 0.14 to 0.31, the thickness of the solder layer at the surface of the copper bump 37 is 0.07 to 0.12, the longitudinal length F2 of the bonding pad 35 is 1.90, the lateral length G2 thereof is 1.72, and the thickness of Au film is $0.34 \times 10^{-3}$ to $2.41 \times 10^{-3}$. The thickness of the Au film may be $0.34 \times 10^{-3}$ to $1.72 \times 10^{-3}$.

As described above, the thickness of the Au film is set to be not less than $0.34 \times 10^{-3}$ in the case in which the diameter of the copper bump 37 is set to be 1. When the thickness of the Au film is $0.34 \times 10^{-3}$, the Au content in the soldering junction is not less than 1 percent.

For example, when the bump diameter of the copper bump 37 is 290 μm, the opening diameter is 180 μm, the thickness of the bump is 41 μm to 90 μm, the thickness of the solder layer is 20 μm to 35 μm, the longitudinal length F2 of the bonding pad 12 is 550 μm, the lateral length G2 thereof is 500 μm, and the thickness of the Au film is 0.1 μm to 0.7 μm. The thickness of the Au film may be 0.1 μm to 0.5 μm.

When a magnetic head provided with the junction assembly of the bonding pad and the bump according to the present invention is manufactured, precipitation of compounds of Au and Sn at a soldering junction with a wiring member can be suppressed. Consequently, a superior quality magnetic head device, in which bonding strength of the soldering junction is high and connection failure with the wiring member seldom occurs, can be manufactured.

Since mechanical vibration are frequently generated in magnetic head devices and mechanical force are frequently applied to soldering junctions thereof, it is effective to improve bonding strength of the soldering junction by using the bonding pad according to the present invention.

The junction assembly of the present invention can be applied not only to magnetic head devices, but also to conductive connection units for electric/electronic devices and common mechanical devices, provided with portions to be wired for conductive connection by using bonding pads and bumps.

According to the present invention, as described above in detail, when bonding pads and copper bumps are bonded to each other by soldering, the amount of Au melting into soldering junction can be reduced, the amount of precipitation of compounds of Au and Sn in the solder or on the surface thereof can be reduced, and the bonding strength of the soldering junction can therefore be enhanced.

In addition, when a magnetic head is manufactured by using the bonding pad according to the present invention, connection failures at the bonding pad portion are unlikely, so that a superior quality magnetic head device can be manufactured.

What is claimed is:

1. A junction assembly, comprising:
   a first conductive pattern;
   a bonding pad electrically coupled to the first conductive pattern;
   an Au film disposed on a surface of the bonding pad;
   a wiring member having a bump electrically coupled to a second conductive pattern;
   wherein the bonding pad and the bump are bonded together at a solder junction that has an Au content that is not more than 9 percent by weight.

2. A junction assembly according to claim 1, wherein the Au content of the solder junction is not more than 7 percent by weight.

3. A junction assembly, according to claim 2, wherein a diameter of the bump is 1, a thickness of the Au film is between $0.34 \times 10^{-3}$ to $1.72 \times 10^{-3}$.

4. A junction assembly according to claim 3, further comprising a film encircling the bump having a diameter of about 0.62, and wherein the axial length of the bump measured from a lower surface of the wiring member is between 0.14 to 0.31, and wherein a solder thickness on a surface of the bump is between 0.07 to 0.12, and wherein a planar size of the bonding pad is about 1.90×1.72.

5. A junction assembly, according to claim 4, wherein the bonding pad is a layered structure comprising a Cu film underlying an Ni film underlying the Au film.

6. A magnetic head device comprising:
   a load beam;
   a flexure provided at a front portion of the load beam;
   a magnetic head mechanically coupled to the flexure; and
   a substrate supporting the first conductive pattern, the first conductive pattern having been electrically coupled to the magnetic head; wherein the wiring member is bonded to the substrate by the junction assembly according to claim 5.

7. A function assembly according to claim 6 further comprising a base portion coupled to the load beam.

8. A magnetic head device comprising:

a load beam;

a flexure provided at a front portion of the load beam;

a magnetic head mechanically coupled to the flexure; and a substrate supporting the first conductive pattern, the first conductive pattern having been electrically coupled to the magnetic head; wherein the wiring member is bonded to the substrate by the junction assembly according to claim 4.

9. A junction assembly according to claim 8 further comprising a base portion coupled to the load beam.

10. A junction assembly according to claim 3, wherein the bonding pad is a layered structure comprising a Cu film underlying an Ni film underlying the Au film.

11. A magnetic head device comprising:

a load beam;

a flexure provided at a front portion of the load beam;

a magnetic head mechanically coupled to the flexure; and a substrate supporting the first conductive pattern, the first conductive pattern having been electrically coupled to the magnetic head; wherein the wiring member is bonded to the substrate by the junction assembly according to claim 10.

12. A magnetic head device comprising:

a load beams a flexure provided at a front portion of the load beam;

a magnetic head mechanically coupled to the flexure; and a substrate supporting the first conductive pattern, the first conductive Pattern having been electrically coupled to the magnetic head; wherein the wiring member is bonded to the substrate by the junction assembly according to claim 3.

13. A junction assembly according to claim 2, wherein the bonding pad is a layered structure comprising a Cu film underlying an Ni film underlying the Au film.

14. A magnetic head device comprising:

a load beam;

a flexure provided at a front portion of the load beam;

a magnetic head mechanically coupled to the flexure; and a substrate supporting the first conductive pattern, the first conductive pattern having been electrically coupled to the magnetic head, wherein the wiring member; by the junction assembly according to claim 13.

15. A junction assembly according to claim 14 further comprising a base portion coupled to the load beam.

16. A magnetic head device comprising:

a load beam;

a flexure provided at a front portion of the load beam;

a magnetic head mechanically coupled to the flexure; and a substrate supporting the first conductive pattern, the first conductive pattern having been electrically coupled to the magnetic head; wherein the wiring member is bonded to the substrate by the junction assembly according to claim 2.

17. A junction assembly according to claim 16 further comprising a base portion coupled to the load beam.

18. A junction assembly, according to claim 1, wherein a diameter of the bump is 1, a thickness of the Au film is between $0.34 \times 10^{-3}$ to $2.41 \times 10^{-3}$.

19. A junction assembly according to claim 18, further comprising a film encircling the bump having a diameter of about 0.62, and wherein the axial length of the bump measured from a lower surface of the wiring member is between 0.14 to 0.31, and wherein a solder thickness on the surface of the bump is between 0.07 to 0.12, and wherein a planar size of the bonding pad is about $1.90 \times 1.72$.

20. A junction assembly, according to claim 19, wherein the bonding pad is a layered structure comprising a Cu film underlying an Ni film underlying the Au film.

21. A magnetic head device comprising:

a load beam;

a flexure provided at a front portion of the load beam;

a magnetic head mechanically coupled to the flexure; and a substrate supporting the first conductive pattern, the first conductive pattern having been electrically coupled to the magnetic head; wherein the wiring member is bonded to the substrate by the junction assembly according to claim 20.

22. A magnetic head device comprising:

a load beam;

a flexure provided at a front portion of the load beam;

a magnetic head mechanically coupled to the flexure; and a substrate supporting the first conductive pattern, the first conductive pattern having been electrically coupled to the magnetic head; wherein the wiring member is bonded to the substrate by the junction assembly according to claim 19.

23. A junction assembly according to claim 18, wherein the bonding pad is a layered structure comprising a Cu film underlying an Ni film underlying the Au film.

24. A magnetic head device comprising:

a load beam;

a flexure provided at a front portion of the load beam;

a magnetic head mechanically coupled to the flexure; and a substrate supporting the first conductive pattern, the first conductive pattern having been electrically coupled to the magnetic head; wherein the wiring member is bonded to the substrate by the junction assembly according to claim 23.

25. A magnetic head device comprising:

a load beams a flexure provided at a front portion of the load beam;

a magnetic head mechanically coupled to the flexure; and a substrate supporting the first conductive pattern, the first conductive pattern having been electrically coupled to the magnetic head; wherein the wiring member is bonded to the substrate by the junction assembly according to claim 18.

26. A junction assembly, according to claim 1, wherein the bonding pad is a layered structure comprising a Cu film underlying an Ni film underlying the Au film.

27. A magnetic head device comprising:

a load beam;

a flexure provided at a front portion of the load beam;

a magnetic head mechanically coupled to the flexure; and a substrate supporting the first conductive pattern, the first conductive pattern having been electrically coupled to the magnetic head; wherein the wiring member is bonded to the substrate by the junction assembly according to claim 26.

28. A magnetic head device comprising:

a load beam;

a flexure provided at a front portion of the load beam;

a magnetic head mechanically coupled to the flexure; and a substrate supporting the first conductive pattern, the first conductive pattern having been electrically coupled to the magnetic head; wherein the wiring member is bonded to the substrate by the junction assembly according to claim 1.

29. A magnetic head device according to claim 28, wherein in the junction assembly, the Au content of the solder junction is not more than 7 percent by weight.

30. A magnetic head device according to claim 29, wherein in the junction assembly, the bonding pad is a layered structure comprising a Cu film underlying an Ni film underlying the Au film.

31. A magnetic head device according to claim 28, wherein in the junction assembly, the diameter of the bump is 1, a thickness of the Au film is between $0.34 \times 10^{-3}$ to $1.72 \times 10^{-3}$.

32. A magnetic head device according to claim 28, wherein the junction assembly further comprising a substrate supporting the first conductive pattern.

33. A magnetic head device according to claim 28, wherein the Au content is not less than 1 percent by weight.

34. A magnetic head device according to claim 28, wherein a thickness of the bump is 0.14 to 0.31 of a diameter of the bump.

35. A magnetic head device according to claim 28, wherein a thickness of a solder layer at a surface of the bump is 0.07 to 0.12 of a diameter of the bump.

36. A magnetic head device according to claim 28, wherein a thickness of the Au film is 0.1 $\mu$m to 0.7 $\mu$m.

37. A magnetic head device according to claim 28, wherein a thickness of the Au film is $0.34 \times 10^{-3}$ to $2.41 \times 10^{-3}$ of a diameter of the bump.

38. A magnetic head device according to claim 28, wherein a thickness of the Au film is $0.34 \times 10^{-3}$ to $1.72 \times 10^{-3}$ of a diameter of the bump.

39. A magnetic head device according to claim 28, wherein a thickness of the bump is 41 $\mu$m to 90 $\mu$m.

40. A magnetic head device according to claim 28, wherein a thickness of a solder layer at a surface of the bump is 20 $\mu$m to 35 $\mu$m.

41. A magnetic head device according to claim 28, wherein a cracking rate of the solder junction is not more than 1%.

42. A magnetic head device according to claim 28, wherein the Au content is not more than 7 percent by weight.

43. A magnetic head device according to claim 28, wherein a thickness of the Au film is 0.1 $\mu$m to 0.5 $\mu$m.

44. A magnetic head device according to claim 28, wherein a shearing strength of the solder junction is not less than 531 gf.

45. A magnetic head device according to claim 28, wherein a shearing strength of the solder junction is not less than 560 gf.

46. A magnetic head device according to claim 28, wherein a relative diameter of solder wetting, relative to a diameter of solder wetting of the solder junction having an Au content that is not more that 9 percent, is not less than about 1.05.

47. A magnetic head device according to claim 28, wherein a peel strength of the solder junction is not less than 40 g.

48. A junction assembly according to claim 1, further comprising a substrate supporting the first conductive pattern.

* * * * *

UNITED STATES PATENT AND TRADEMARK OFFICE
CERTIFICATE OF CORRECTION

PATENT NO.    : 6,477,016 B1
DATED         : November 5, 2002
INVENTOR(S)   : Ooki Yamaguchi et al.

It is certified that error appears in the above-identified patent and that said Letters Patent is hereby corrected as shown below:

Column 11,
Line 3, delete "function" and substitute -- junction -- in its place.
Line 35, delete "Pattern" and substitute -- pattern -- in its place.
Line 49, delete "head, wherein the wiring member; by" and substitute -- head; wherein the wiring member is bonded to the substrate by -- in its place.

Column 12,
Line 45, immediately after "beams" insert -- ; -- (semicolon).

Signed and Sealed this

Twenty-second Day of April, 2003

JAMES E. ROGAN
*Director of the United States Patent and Trademark Office*